United States Patent [19]

Eckrich

[11] Patent Number: 5,403,980
[45] Date of Patent: Apr. 4, 1995

[54] TOUCH SENSITIVE SWITCH PADS

[75] Inventor: Karl M. Eckrich, Ames, Iowa

[73] Assignee: Iowa State University Research Foundation, Inc., Ames, Iowa

[21] Appl. No.: 103,345

[22] Filed: Aug. 6, 1993

[51] Int. Cl.⁶ .................. H01H 35/00; H01H 9/00; H05K 1/00
[52] U.S. Cl. .................. 200/52 R; 200/292; 200/DIG. 2; 174/257; 361/751
[58] Field of Search .............. 200/5 A, 52 R, 61.05, 200/512–517, 314, 315, 292; 174/250–264; 361/748–751

[56] References Cited

U.S. PATENT DOCUMENTS

| | | | |
|---|---|---|---|
| 3,207,905 | 9/1965 | Bray | 200/DIG. 2 X |
| 3,538,389 | 11/1970 | Levesque et al. | 361/777 |
| 3,728,501 | 4/1973 | Larson et al. | 200/52 R |
| 3,860,771 | 1/1975 | Lynn et al. | 200/5 A |
| 4,127,740 | 11/1978 | LaMarche | 200/5 A X |
| 4,211,497 | 7/1980 | Montgomery | 200/5 A X |
| 4,230,967 | 10/1980 | Holz et al. | 361/278 X |
| 4,495,485 | 1/1985 | Smith | 200/600 X |
| 4,527,021 | 7/1985 | Morikawa et al. | 200/5 A |
| 4,795,861 | 1/1989 | O'Rourke | 200/5 A |
| 4,857,683 | 8/1989 | Maser | 200/5 A |
| 4,939,428 | 7/1990 | DePauli | 200/5 A X |
| 5,286,357 | 2/1994 | Smart et al. | 204/153.11 |

Primary Examiner—J. R. Scott
Attorney, Agent, or Firm—Henderson & Sturm

[57] ABSTRACT

A touch sensitive switch pad. The switch pad includes a flexible film with a two conductive ink patterns on one side and an adhesive on the other. The adhesive backing can be of the peel off type such that a user simply peels off a protective backing to reveal the adhesive. The conductive ink patterns are disposed sufficiently close to each other such that there is a high probability that when a user touches the pad, a closed circuit occurs between the two patterns. Each conductive ink pattern is connected to an electrical contact which in turn can be connected to switching circuitry which is sensitive enough to sense the high resistance closed circuit. An extra adhesive-backed flap connected to the film and disposed in close proximity to the electrical contacts can be used to help protect the electrical contacts.

19 Claims, 4 Drawing Sheets

U.S. Patent    Apr. 4, 1995    Sheet 1 of 4    5,403,980
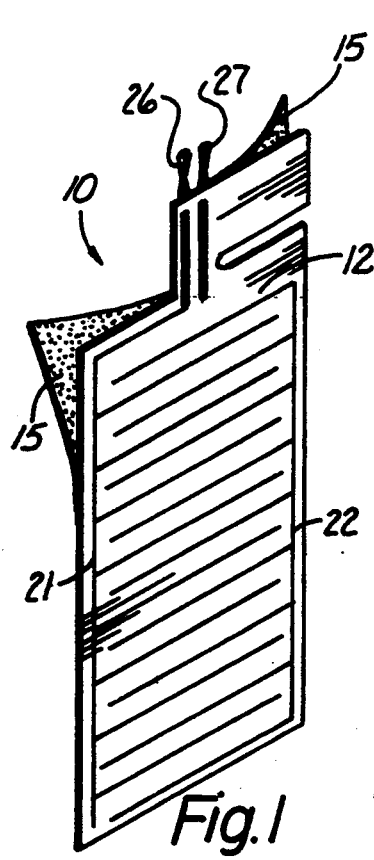
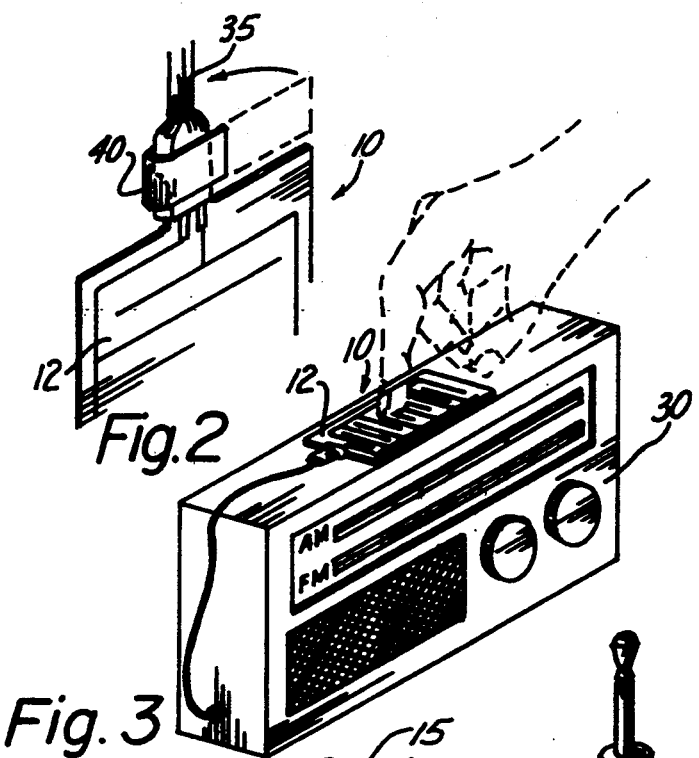
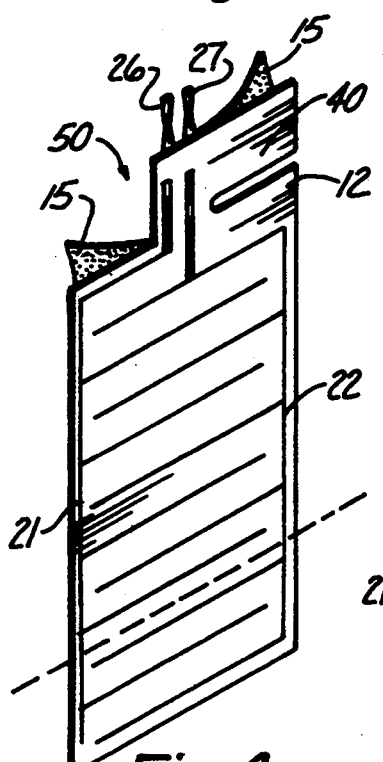
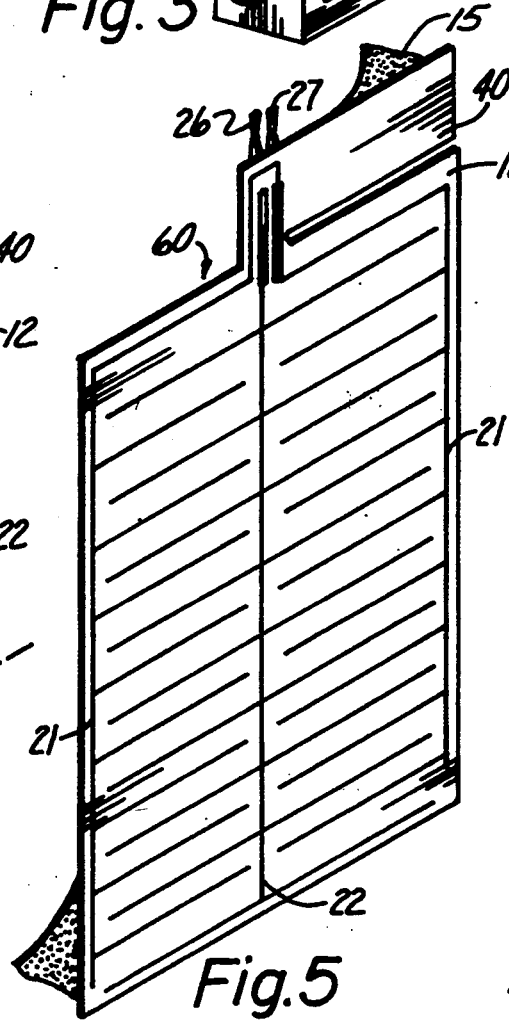
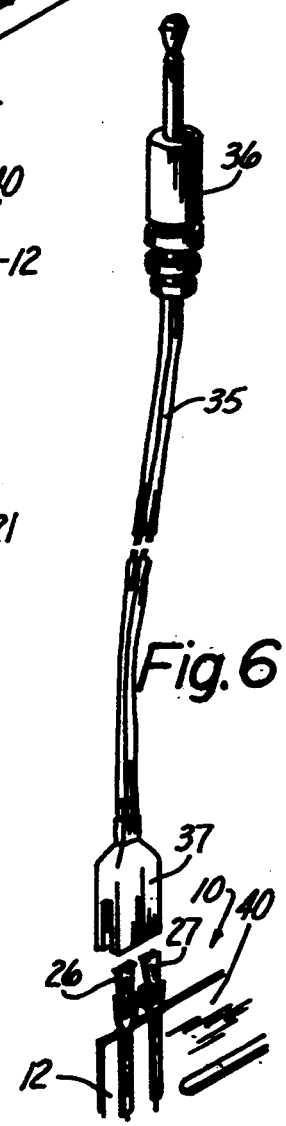

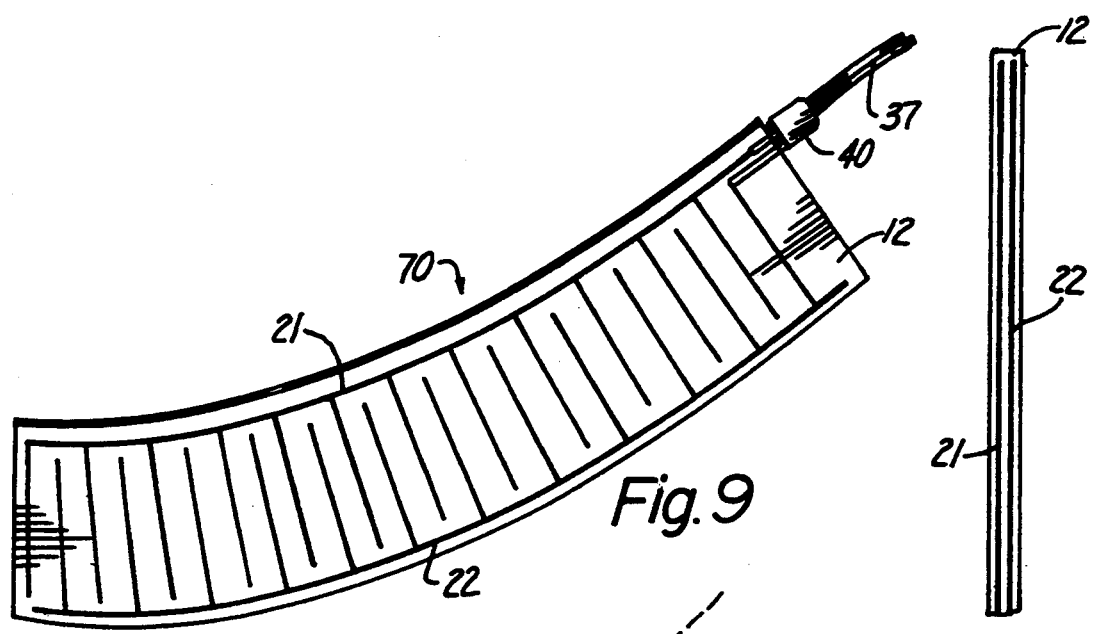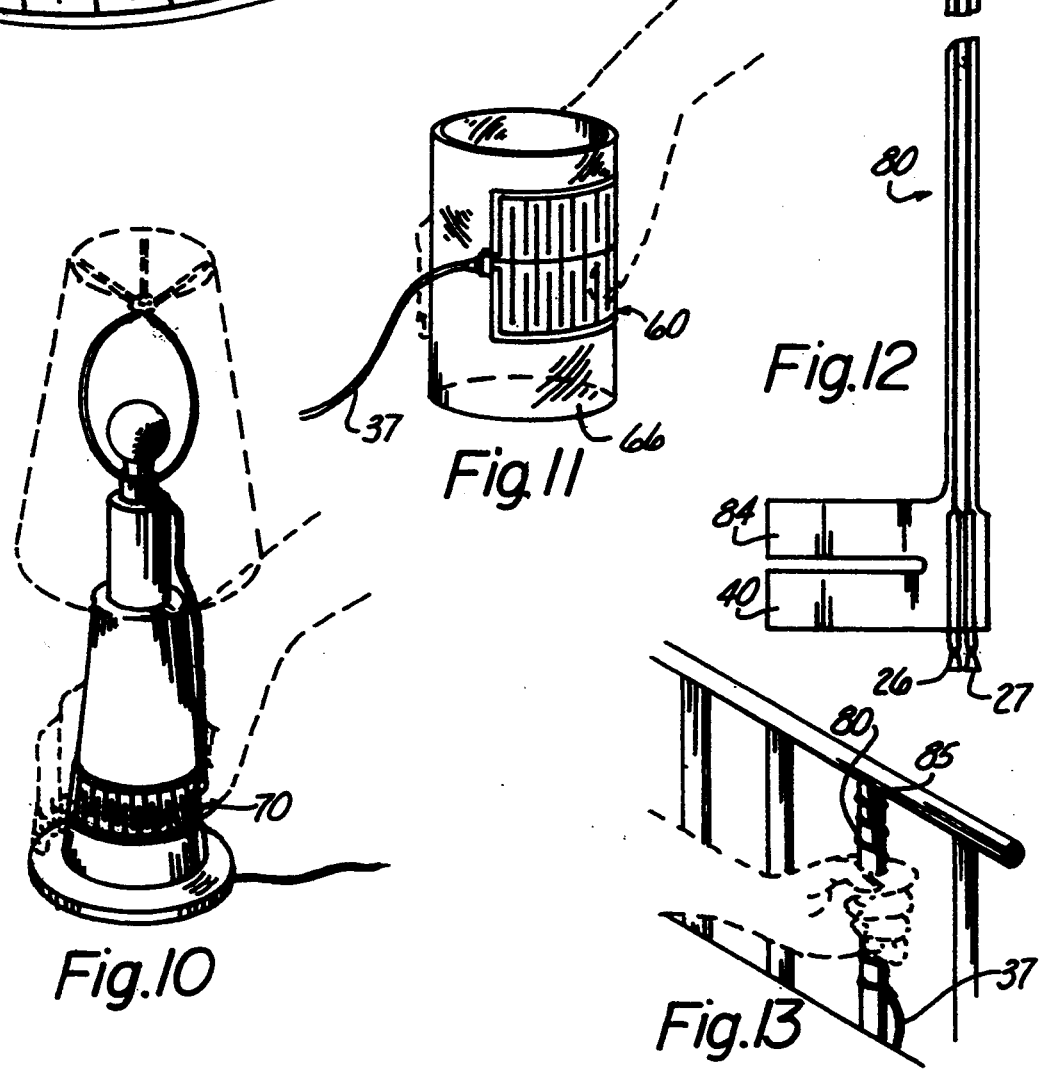

TOUCH SENSITIVE SWITCH PADS

AUTHORIZATION PURSUANT TO 37 CFR 1.71 (d) (e)

A portion of the disclosure of this patent document may contain material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

1. Technical Field

The present invention relates generally to touch sensitive pads used for electrical switching and specifically to a flexible film with an adhesive compound on one side and a conductive ink pattern on the other.

2. Background Art

Touch sensitive switches are used to allow the simple action of touching a device to trigger some form of electrical response. For example, a touch sensitive switch can be used to turn a radio or light on and off. Another example is using a touch sensitive switch to make a selection wherein a user simply touches the desired choice. The latter example is often used in computers with touch sensitive screens.

Many of the touch sensitive switches are activated by the pressure exerted by the user onto the surface of the touch sensitive area. Two significant practical limitations of the pressure type touch sensitive switches are their high cost and low adaptability and flexibility especially on non-planer surfaces. As a result of these limitations, a pressure type touch sensitive switch is typically designed and manufactured for a specific purpose and therefore does not allow the user ample leeway to adapt the switch to their custom uses or individual needs.

A second type of touch sensitive switch uses thin strips of conductive material, typically conductive ink. The conductive ink is applied to the target object or surface which the user desires to operate as a switch. The conductive ink is applied in two, electrically separate patterns and a relatively small voltage is applied across the two patterns. When the user touches the target object or surface, the hand or fingers connect the two patterns and thus closes the switch. Because the voltage is relatively small and the resistance of the skin is relatively high, only a very small current of approximately $5 \times 10^{-7}$ amps flows through the skin. This small amount of current flowing through the skin is not noticeable to the user who is touching the target object or surface.

The relatively small voltage is provided by an electronic circuit which is capable of detecting the small current created when the user touches the target device or surface on which are the conductive ink patterns. The electronic circuit then triggers the appropriate electrical response. For example, the electronic circuit could be incorporated into a radio. When the user touches the portion of the radio which has the conductive ink patterns, the electronic circuit will turn the radio on. Similarly, the switch can be used to turn the radio off.

The use of conductive ink pattern allows for a much wider variety of surfaces to be used as touch sensitive switches and accomplishes this at a much lower cost since typically the component parts of the conductive ink type switch are significantly less expensive than the necessary parts for a pressure sensitive switch. However, limitations for this type of switch do exist. Some surface are not conducive to receiving the conductive ink. Another limitation is that applying the patterns to the various target objects or surfaces can take significant time which in addition to being an inconvenience can add to the expense. Typically, the conductive ink patterns are applied with stencils. Depending on the shape of the objects, different or custom stencils have to be made and used.

Therefore, an improved touch sensitive switch is needed which is responsive to the previously discussed limitations.

DISCLOSURE OF THE INVENTION

The present invention relates generally to touch sensitive switch pads used for electrical switching and specifically to a flexible film with an adhesive compound on one side and a conductive ink pattern on the other. The present invention uses a plastic film material. Two separate conductive ink patterns are applied on one surface of the film. The two conductive ink patterns are electrically separate such that when a small voltage is applied across the ink patterns, the circuit is open. When a user touches the film, the user's hand or fingers closes the circuit and a small current passes through the hand or fingers. The electronic circuit which provided the small voltage across the conductive ink pattern detects the small voltage and therefore knows that the switch has been closed.

On the other surface of the film there is an adhesive backing. With the adhesive backing, the film can be applied to virtually any surface which a user desires to operate as a switch.

The conductive ink patterns are connected to the electronic circuit by a cable. The cable is connected to the film by connecting to two solder tabs. Each of the two solder tabs are connected to one of the conductive ink patterns. An additional flap can be connected to the film which can be wrapped around the solder connection to help protect the connection during use.

The film of the present invention can be trimmed from one end without affecting the operation of the switch.

An object of the present invention is to provide an improved touch sensitive switch.

Another object of the present invention is to provide a touch sensitive switch pad which utilizes a film with conductive ink patterns.

Another object of the present invention is to provide a touch sensitive switch pad which is reliable, flexible, adaptable and economical.

Still another object of the present invention is to provide a touch sensitive switch pad which has an adhesive backing.

Other objects, advantages, and novel features of the present invention will become apparent from the following detailed description of the invention when considered in conjunction with the accompanying drawings.

BRIEF DESCRIPTION OF THE DRAWINGS

FIG. 1 is a perspective view of a touch sensitive switch pad built in accordance with the present invention;

FIG. 2 is a partial perspective view of the touch sensitive pad of FIG. 1 showing the extra flap wrapped around the electrical contacts;

FIG. 3 is a perspective view of a radio utilizing the touch sensitive switch pad of FIG. 1;

FIG. 4 is a perspective view of another embodiment of the present invention;

FIG. 5 is a perspective view of still another embodiment of touch sensitive pad built in accordance with the present invention;

FIG. 6 is a partial perspective view showing how an electrical cord can connect to the touch sensitive switch pad;

FIG. 9 is a perspective view of still another embodiment of a touch sensitive switch pad built in accordance with the present invention;

FIG. 10 is a perspective view of a lamp utilizing the touch sensitive switch pad of FIG. 9;

FIG. 11 is a perspective view of a glass utilizing the touch sensitive switch pad of FIG. 5;

FIG. 12 is a front view of yet another embodiment of the present invention;

FIG. 13 is a perspective view of a railing utilizing the touch sensitive switch pad of FIG. 12;

BEST MODES FOR CARRYING OUT THE INVENTION

Figure 7:
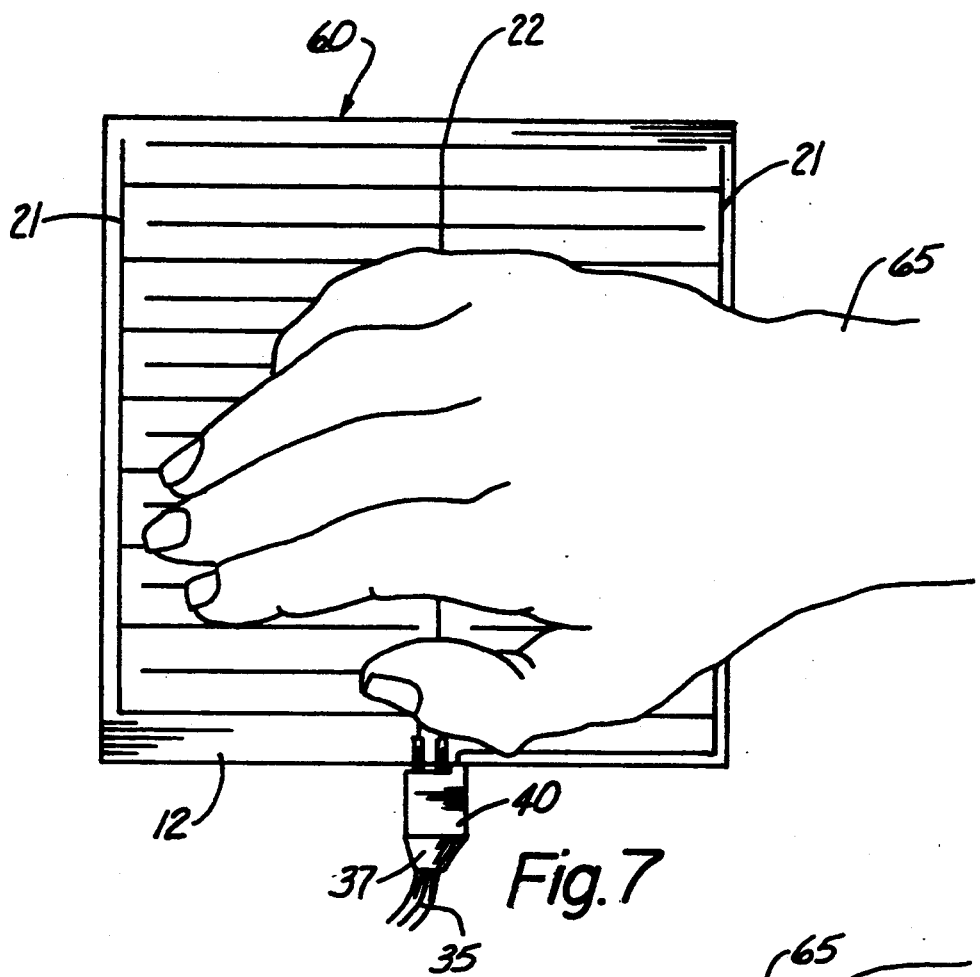
FIG. 7 is a front view of the touch sensitive switch pad of FIG. 5 showing a user completing the switch circuit.

Referring now to the drawings wherein like reference numerals designate identical or corresponding parts throughout the several views, FIG. 1 shows a touch sensitive switch pad (10) built in accordance with the present invention. The touch sensitive switch pad (10) includes a film (12) which has an adhesive backing applied to the back surface of the film (12). The adhesive backing can be covered with a peel away paper backing (15) such as those used on a decal or on a sticker. The peel away paper backing (15) can thus be peeled off the film (12) and the film (12) can be attached to virtually any surface.

Various types of adhesive can be used in the adhesive backing depending upon the surface to which the film (12) is to be attached and depending upon how important it is to be able to remove the film (12). In order to make the film the most adaptable to all surfaces, typically the strongest adhesive available should be used. However, practically any adhesive could be used and the adhesive backing need not be limited to the glue type. Placing a loop and hook, or velcro type, backing would also work.

The film (12) is made of a clear polyester material which is approximately five (5) millimeters thick. The polyester material is ideally suited for the present invention because it is clear, flexible durable and provides a good adhering surface to which the adhesive backing and the conductive ink, discussed in detail below, can be applied.

On the front surface of the film (12) a first conductive ink pattern (21) and a second conductive ink pattern (22) are applied. The conductive ink used in the conductive ink patterns (21 and 22) is a silver ink and carbon ink composite. The silver ink is used to optimize electrical conductivity and the carbon ink is used to optimize resistance to corrosion. The color of the ink is silver opaque. Clear or nearly transparent conductive inks may be used and may be better when concealing the ink patterns is desirable or paramount but typically transparent conductive inks are not as durable.

The design of the first pattern (21) and the second pattern (22) must be such that the two patterns (21 and 22) do not intersect, thus remaining electrically separate. Additionally, the two patterns (21 and 22) must always remain in close proximity to one another, or close enough such that when a typical user touches the film with his or her hand or fingers, both patterns will usually be touched. In the present embodiment, each pattern is fork shaped with the tines meshing together.

The conductive ink patterns (21 and 22) are connected to solder tabs (26 and 27), respectively, such that the conductive ink patterns (21 and 22) can be operably connected to an electronic circuit (not shown). In the present embodiment, the solder tabs (26 and 27) are placed on the back side of the film (12). The conductive ink patterns (21 and 22) are electrically connected to the solder tabs (26 and 27) through the film (12).

The electronic circuit (not shown) places a small voltage across the conductive ink patterns (21 and 22). Since the patterns (21 and 22) are electrically separate, the switch pad circuit is open. When a user touches the film (12) with his or her hand or fingers in such a way that both conductive ink patterns are touched simultaneously, the switch circuit is closed, or switched, and a small current flows through switch circuit including through the fingers or hand. Because the voltage is small and the resistance of the skin is high, only a very small current of approximately $5 \times 10^{-7}$ amps flows through the switch circuit and through the skin. This small amount of current flowing through the skin is not noticeable to the user who is touching the film (12).

While the current is too small to be detectable by the user, the electronic circuit which provided the voltage across the conductive ink patterns (21 and 22) is sensitive enough to detect that a current is now flowing through the switch circuit. The electronic circuit thus triggers the appropriate device for the touch sensitive switch pad (12). For example, as can be seen in FIG. 3, the touch sensitive switch pad (10) has been attached to a radio (30). An electronic circuit as described above has been integrated into the radio such that when the touch sensitive switch pad (10) switch circuit is closed by a user touching the film (12), the electronic circuit senses the current and thus turns the radio on. Similarly, the touch sensitive switch pad (10) could be used to turn the radio off either by having a separate touch sensitive switch pad for off or by touching the same pad if the electronic circuit is connected to a toggle on/off type circuit. If it is the toggle type, the user simply touches the pad (10) once to turn it on and touches the pad (10) again to turn it off.

Referring to FIG. 6, a cable (35) can be connected to the touch sensitive switch pad (10). One end of the cable (35) has an one-eighth inch plug (36) which can be used to plug into any device capable of utilizing a low amp switch like the present invention. The other end of the cable (35) is a connector (37) which is attached to the solder tabs (26 and 27) of the touch sensitive switch pad (10). The connection can either be by friction fit or by solder but clearly solder is more reliable.

Referring to FIG. 2, a flap (40) can be connected to the film (12). The flap (15) is connected to the film (12) in close proximity to the solder tabs (26 and 27) such that it may be wrapped around the solder pins (26 and 27) and connector (37) on the cable (35) after the cable has been connected. Wrapping the flap (40) around the solder tabs (26 and 27) and connector (37) helps to protect the connection and make it more durable. Obviously if the touch sensitive pad (10) were electrically connected to some other device by means of something other than a cable, wrapping the flap (40) around the solder tabs (26 and 27) would still help protect the connection.

Referring now to FIG. 4, another embodiment of a touch sensitive switch pad (50) is shown. The touch sensitive switch pad (50) of this embodiment is identical to the touch sensitive switch pad (10) of FIG. 1 with the exception that the gaps between the two patterns are larger in the embodiment shown in FIG. 4. In both embodiments the approximate size of the touch sensitive switch pad is two (2) inches by four (4) inches. The present embodiment might be used in cases were visibility through the touch pad (50) is at a premium. However, the increased visibility is at the cost of slightly increasing the chance that when a user touches the pad (50) that both conductive ink patterns (21 and 22) will not be touched.

Still referring to FIG. 4, a dashed line (52) is shown dividing the touch sensitive switch pad (50). If the touch sensitive switch pad (50) were cut along this line and the bottom portion was removed, the touch sensitive switch pad (50) would be smaller but still fully functional. This feature holds for all of the embodiments disclosed herein. If the pad is trimmed in this manner, the end of the touch sensitive switch pad containing the solder tabs (26 and 27) will still be functional.

Figure 8:
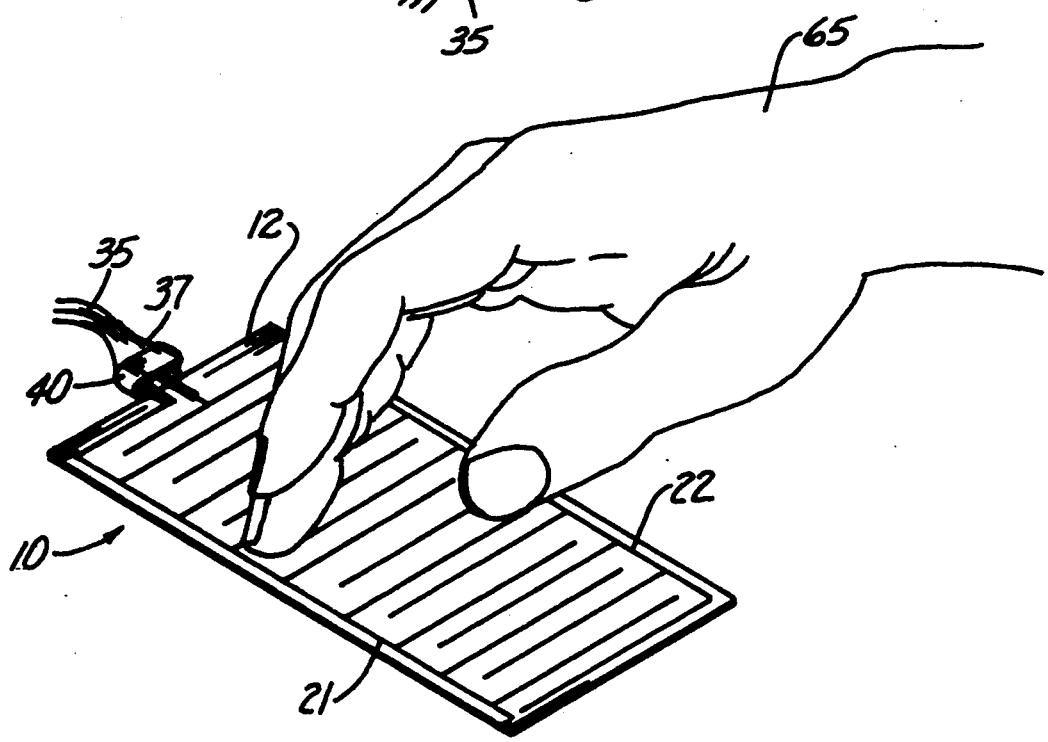
FIG. 8 is a perspective view of the touch sensitive switch pad of FIG. 4 showing a user completing the circuit.

Referring to FIG. 5, yet another embodiment of a the touch sensitive switch pad (60) built in accordance with the present invention is shown. This embodiment is larger and is approximately three (3) by five (5) inches. The touch sensitive switch pad (60) use two conductive ink patterns (21 and 22) as described above except that the patterns are larger and repeated. Referring to FIGS. 7 and 8, touch sensitive pads (60 and 10) are shown being touched by a user's hand (65). Referring to FIG. 11, the touch sensitive switch pad (60) is shown attached to a glass (66).

Referring now to FIG. 9, a touch sensitive switch pad (70) in an arcuate shape is shown. This touch sensitive switch pad (70) is similar to the switch pads described above but the arcuate shape makes it ideal for applications in which the target object, or object to which the touch sensitive switch pad (70) is to be applied, is conically shaped. Referring to FIG. 10, a conically shaped lamp (77) is shown with the touch sensitive switch pad (70) attached.

Referring now to FIG. 12, still another embodiment of a touch sensitive switch pad (80) built in accordance with the present invention is shown. In this embodiment, the film (12) is long, approximately twenty (20) inches, and narrow, approximately one tenth (0.1) of an inch. The first conductive ink pattern (21) is a single line running the entire length of the film (12). The second conductive ink pattern (22) also runs the entire length of the film (12) and runs parallel to the first conductive ink pattern (21). This embodiment is ideally suited for odd shaped target objects because the film (12) can simply be spirally wrapped around the object. In addition to flap (40) which protects the connection of the solder tabs (26 and 27), a second flap (84) is provided to help adhere the film (12) to the target object.

Figure 14:
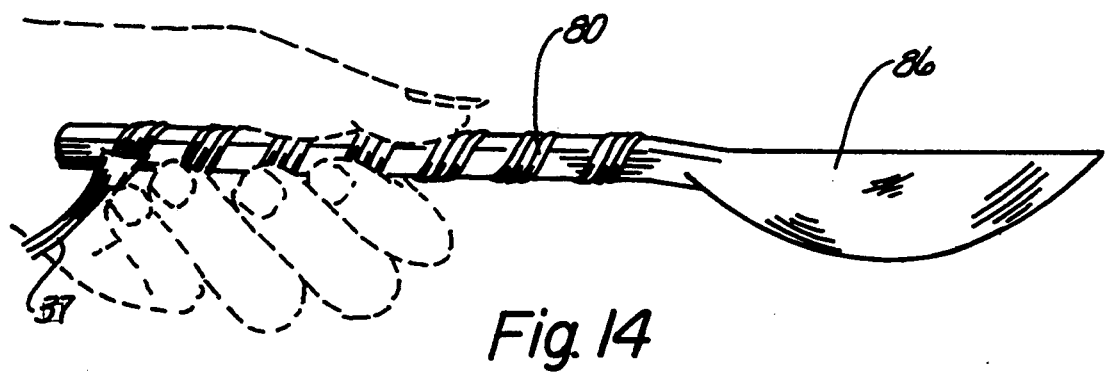
FIG. 14 is a perspective view of a spoon utilizing the touch sensitive switch pad of FIG. 12.
Figure 15:
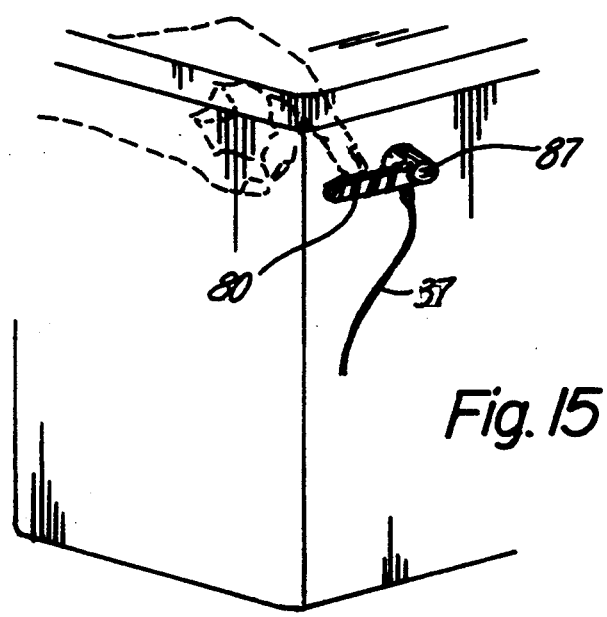
FIG. 15 is a perspective view of a toilet flushing handle utilizing the touch sensitive switch pad of FIG. 12.

Referring to FIG. 13, the touch sensitive switch pad (80) is shown attached to a railing (85). Referring to FIG. 14, the touch sensitive switch pad (80) is shown attached to a spoon (86). Referring to FIG. 15, the touch sensitive switch pad (80) is shown attached to a toilet flushing handle (87). The significance of attaching a touch sensitive pad to items like these are that they can be plugged into a warning unit that will alert the appropriate people when a certain signal is received. For example, the spoon (86) might be used by a person whom has difficultly communicating to indicate that he or she is hungry. The by activating the touch sensitive switch pad (80) it would be possibly to signal to a care provider that this person needs food. Similarly the glass (66) in FIG. 11 could signal that the person is thirsty and the handle (87) of FIG. 15 could indicate that the person has to go to the bathroom.

Obviously, many modifications and variations of the present invention are possible in light of the above teachings. It is therefore to be understood that, within the scope of the appended claims, the invention may be practiced otherwise than as specifically described.

I claim:

1. A touch sensitive switch pad actuated by operator resistive bridging, such as skin comprising:
    a flexible film, said film having a first surface and a second surface;
    an adhesive backing distributed on said first surface;
    a first conductive ink pattern disposed on said second surface;
    a second conductive ink pattern disposed on said second surface;
    wherein said first conductive ink pattern and said second conductive ink pattern are separate with respect to each other; and
    means disposed on said film for electrically connecting to said first and said second conductive ink patterns.

2. The touch sensitive switch pad of claim 1 wherein said film is transparent.

3. The touch sensitive switch pad of claim 1 wherein said film is a polyester film.

4. The touch sensitive switch pad of claim 1 wherein said film has a thickness of approximately 5 millimeters.

5. The touch sensitive switch pad of claim 1 wherein said film is of rectangular shape.

6. The touch sensitive switch pad of claim 5 wherein said first surface and said second surface of said film is approximately two (2) inches by four (4) inches.

7. The touch sensitive switch pad of claim 5 wherein said first surface and said second surface of said film is approximately three (3) inches by five (5) inches.

8. The touch sensitive switch pad of claim 5 wherein said first surface and said second surface of said film is approximately one tenth (0.1) of an inch by twenty-four (24) inches.

9. The touch sensitive switch pad of claim 1 wherein the length of said film is significantly greater than the width of said film.

10. The touch sensitive switch pad of claim 1 wherein said film is of arcuate shape.

11. The touch sensitive switch pad of claim 1 wherein the conductive ink used in said first conductive ink pattern and said second conductive ink pattern comprises a silver ink and carbon ink composite.

12. The touch sensitive switch pad of claim 1 wherein the conductive ink used in said first conductive ink pattern and said second conductive ink pattern is highly resistant to corrosion.

13. The touch sensitive switch pad of claim 1 wherein the conductive ink used in said first conductive ink pattern and said second conductive ink pattern is sufficiently resilient to withstand application to non-planer devices.

14. The touch sensitive switch pad of claim 1 wherein the conductive ink used in said first conductive ink pattern and said second conductive ink pattern is transparent.

15. The touch sensitive switch pad of claim 1 wherein said connecting means includes solder tabs.

16. The touch sensitive switch pad of claim 1 wherein said film includes a flap positioned in close proximity to said connecting means whereby said flap can be wrapped around said connecting means to provide protection for said connecting means.

17. The touch sensitive switch pad of claim 1 including:
   a cable wherein one end of said cable is connected to said connecting means; and
   a plug connected to the other end of said cable.

18. A touch sensitive switch pad actuated by operator resistive bridging, such as skin, comprising:
   a flexible film, said film having a first surface and a second surface;
   an adhesive backing distributed on said first surface;
   a first conductive ink pattern disposed on said second surface;
   a second conductive ink pattern disposed on said second surface;
   wherein said first conductive ink pattern and said second conductive ink pattern are separate with respect to each other;
   means disposed on said film for electrically connecting to said first and said second conductive ink patterns;
   wherein said film is transparent;
   wherein said film is a polyester film;
   wherein said film has a thickness of approximately 5 millimeters;
   wherein the conductive ink used in said first conductive ink pattern and said second conductive ink pattern comprises a silver and carbon composite;
   wherein said connecting means includes solder tabs; and
   wherein said film includes a flap positioned in close proximity to said connecting means whereby said flap can be wrapped around said connecting means to provide protection for said connecting means.

19. A touch sensitive switch pad actuated by operator resistive bridging, comprising:
   a flexible film, said film having a first surface and a second surface;
   an adhesive backing distributed on said first surface;
   resistive bridging switching means for creating a closed circuit upon skin contact by an operator, said switching means including a first conductive ink pattern disposed on said second surface and a second conductive ink pattern disposed on said second surface;
   wherein said first conductive ink pattern and said second conductive ink pattern are separate with respect to each other; and
   means disposed on said film for electrically connecting to said first and said second conductive ink patterns.

* * * * *

UNITED STATES PATENT AND TRADEMARK OFFICE
CERTIFICATE OF CORRECTION

PATENT NO. : 5,403,980
DATED : April 4, 1995
INVENTOR(S) : Karl M. Eckrich

It is certified that error appears in the above-indentified patent and that said Letters Patent is hereby corrected as shown below:

In the Abstract:

Second line, delete "a" (second occurance).

Col. 1, line 63, delete "pattern" and substitute --patterns--.
Col. 2, line 2, delete "surface" and substitute --surfaces--.
Col. 2, line 27, delete "pattern" and substitute --patterns--.
Col. 3, line 6, after "of" insert --a--.
Col. 3, line 61, delete "flexible" and substitute --flexible,--.
Col. 4, line 32, after "through" insert --the-.
Col. 4, line 62, delete "an" and substitute --a--.
Col. 5, line 37, delete "the".
Col. 5, line 41, delete "use" and substitute --uses--.
Col. 6, line 15, delete "The by" and substitute --By--.

Column 6:
Claim 1, line 2, delete "skin" and substitute --skin,--.

Signed and Sealed this

First Day of August, 1995

Attest:

BRUCE LEHMAN

*Attesting Officer*     *Commissioner of Patents and Trademarks*